United States Patent [19]

Kobayashi

[11] Patent Number: 4,531,057
[45] Date of Patent: Jul. 23, 1985

[54] APPARATUS AND METHOD FOR ADJUSTING OPTICAL AXIS OF ELECTRON MICROSCOPE

[75] Inventor: Hiroyuki Kobayashi, Katsuta, Japan

[73] Assignee: Hitachi, Ltd., Tokyo, Japan

[21] Appl. No.: 472,233

[22] Filed: Mar. 4, 1983

[30] Foreign Application Priority Data

Mar. 5, 1982 [JP] Japan .............................. 57-33917

[51] Int. Cl.³ ............................................ H01J 37/26
[52] U.S. Cl. ..................................... 250/311; 250/397
[58] Field of Search .................... 250/311, 397, 396 R

[56] References Cited

U.S. PATENT DOCUMENTS

| | | | |
|---|---|---|---|
| 3,919,550 | 11/1975 | Banbury | 250/311 |
| 3,937,959 | 2/1976 | Namae | 250/311 |
| 4,045,669 | 8/1977 | Kamimura et al. | 250/311 |
| 4,068,123 | 1/1978 | Kokubo | 250/311 |
| 4,189,641 | 2/1980 | Katagiri et al. | 250/311 |

Primary Examiner—Bruce C. Anderson
Attorney, Agent, or Firm—Antonelli, Terry & Wands

[57] ABSTRACT

An apparatus and a method for adjusting the optical axis of the electron microscope is disclosed, in which the convergence of the electron beam radiated on a specimen is adjusted by a radiation lens system, the optical axis of the electron beam is adjusted by electron beam deflectors, the electron beam from the specimen is focused to form an enlarged image of the specimen in an image-forming lens system, and the enlarged image is displayed while at the same time detecting the electron beam quantity by a phosphor plate. The optical axis is set by controlling the electron beam deflectors in a manner to maximize the electron beam quantity detected by the phosphor plate.

12 Claims, 5 Drawing Figures

APPARATUS AND METHOD FOR ADJUSTING OPTICAL AXIS OF ELECTRON MICROSCOPE

The present invention relates to an apparatus and a method for adjusting the optical axis of the electron microscope, or more in particular to an apparatus and a method for adjusting the optical axis by controlling electron beam deflectors to maximize the electron beam quantity captured by a phosphor plate.

In conventional electron microscopes, a considerable change of the magnification causes a misalignment of the optical axes of the radiation lens system and the image-forming lens system so that the image under observation is darkened thereby to hamper the observation. Also, the optical axes are misaligned at the time of replacing the filament of the electron gun, similarly darkening the image and making the observation difficult. In order to prevent this inconvenience, the operator usually adjusts the optical axis by deflecting the electron beam in such a manner as to obtain the brightest image under observation by means of electron beam deflectors interposed between the specimen and the radiation lens system or between the electron gun and the radiation lens system. In the event that the optical axis is misaligned and the image is darkened to such a degree that the operator does not know in which direction the electron beam is to be deflected with naked eyes, however, he makes it a rule to deflect the optical axis by trials and errors for timeconsuming adjustments.

Accordingly, it is the object of the present invention to provide an apparatus and a method for adjusting the optical axis of the electron microscope automatically by saving the considerable time and labor which otherwise might be required in the troublesome operation of optical axis adjustment of the electron microscope.

According to one aspect of the present invention, the electron beam is automatically deflected and the optical axis is adjusted in such a manner as to obtain the brightest image constantly taking advantage of the fact that so long as the lens current of the radiation lens system is kept unchanged, the image under observation is brightest or the electron beam quantity on the phosphor plate is maximum when the optical axis of the radiation lens system is aligned with the optical axis of the image-forming lens system.

According to another aspect of the present invention, the optical axis is adjusted by automatically controlling the electron beam deflectors in such a manner that the electron beam spot is radiated at the center of the phosphor plate always when the electron beam spot is radiated on the specimen, in view of the fact that an enlarged image of the electron beam in spot is formed at the center of the phosphor plate for image observation when the electron beam radiated on the specimen is minimized in radius, that is, the electron beam is reduced to a spot form by controlling the lens current of the radiation lens system.

The above and other objects, features and advantages will be apparent from the following detailed description taken in conjunction with the accompanying drawings, in which.

Figure 1:
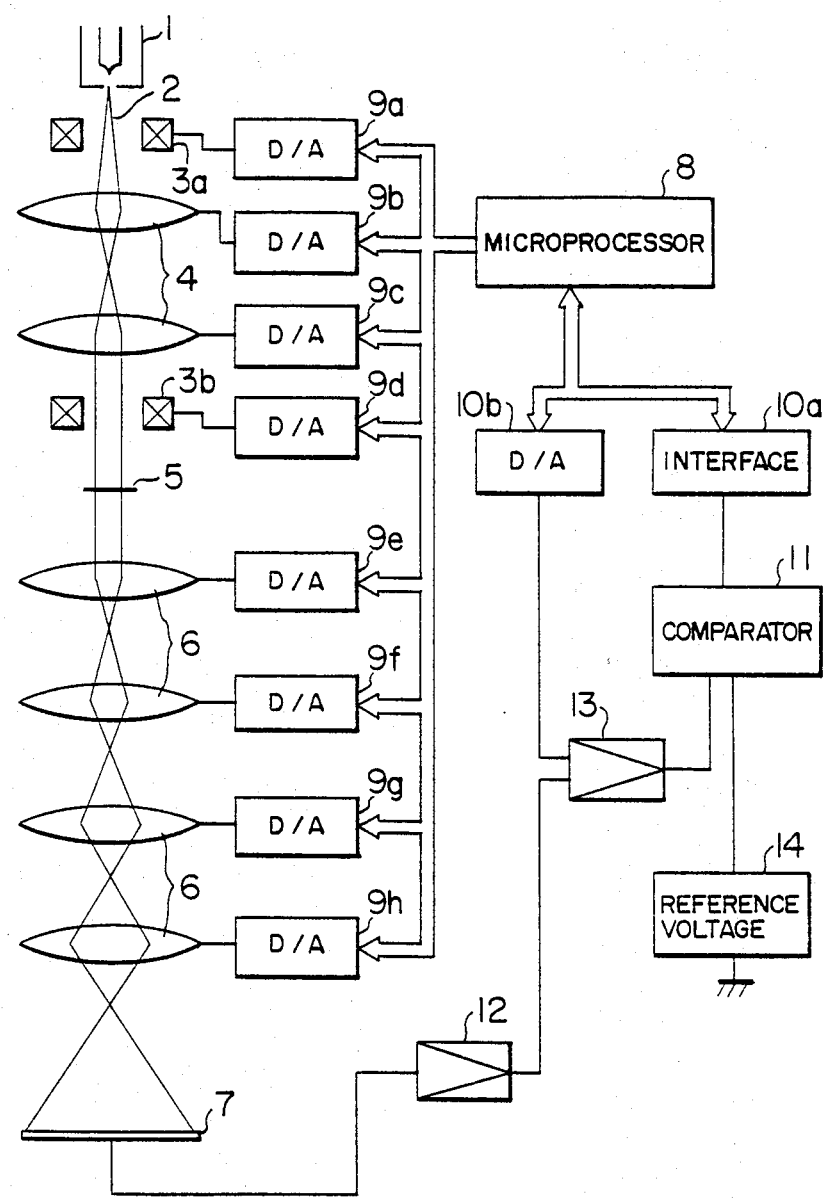
FIG. 1 is a diagram showing the construction of an embodiment of the present invention.

The construction according to an embodiment of the present invention is shown in FIG. 1. An electron beam 2 produced from an electron gun 1 is condensed at a radiation lens system 4 and radiated on a specimen 5. In the process, the electron beam is deflected by electron beam deflectors 3a, 3b to align the optical axes of the radiation lens system 4 and the image-forming lens system 6. The electron beam transmitted through the specimen 5 is enlarged by the image-forming lens system 6 and forms an image on a phosphor plate 7. The phosphor plate 7 functions as an element for detecting the electron beam quantity at the same time. The electron beam radiated on the phosphor plate 7 is thus produced as a current from the phosphor plate 7 and amplified by an amplifier 12 making up an exposure meter. The signal thus amplified is added to the signal supplied from a microprocessor 8 through a D/A converter 10b and is applied to a comparator 11. The comparator 11 compares the sum of these two signals with a reference voltage supplied from a reference voltage source 14 and produces a "higher", "coincidence" or "lower" signal depending on the result of comparison. The microprocessor 8 judges the output of the comparator 11 through an interface 10a and applies a signal to the adder 13 via a D/A converter 10b in such a way that the output of the comparator 11 is the coincidence. The component parts are adjusted in such a manner that the output value of the microprocessor 8 applied to the D/A converter 10b when the comparator 11 produces a coincidence signal represents the electron beam quantity detected at the phosphor plate 7. The electron beam deflectors 3a, 3b are controlled through the D/A converters 9a, 9d respectively, and the radiation lens system 3 and the image-forming lens system 6 are controlled through the D/A converters 9b, 9c and 9e to 9h respectively, by the microprocessor 8.

Figure 2:
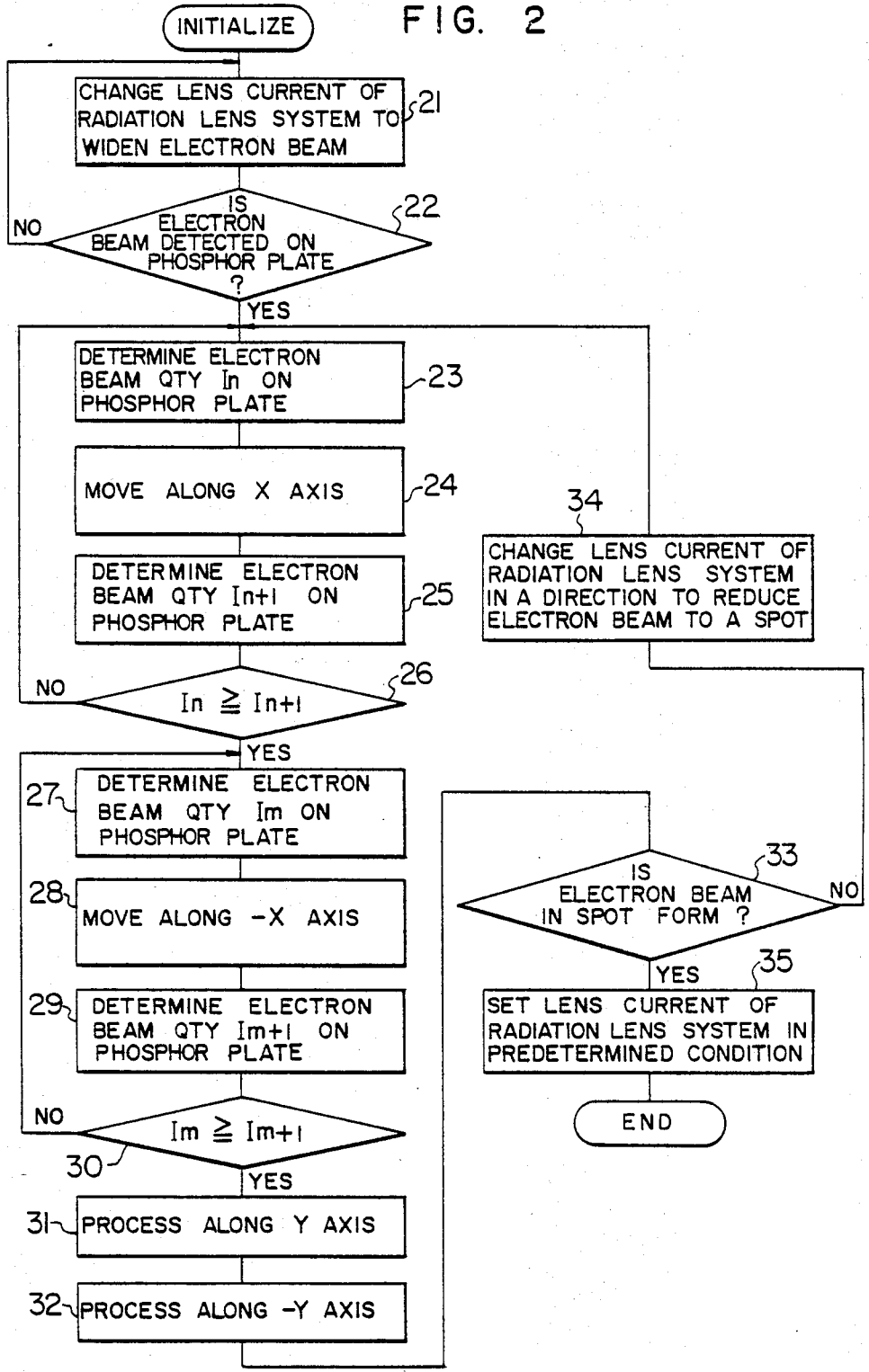
FIG. 2 is a flowchart for explaining the present invention.
Figure 3:
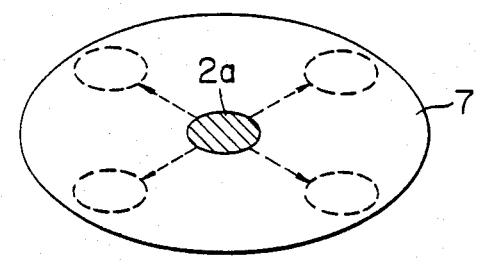
FIG. 3 is a diagram for complementing the explanation of the present invention.

In connection with this configuration, Fig. 2 shows a flowchart for adjusting the optical axes by controlling the electron beam deflectors in such a manner that the image on the phosphor plate is brightest, that is, the electron beam quantity detected at the phosphor plate is maximum. The operation of the apparatus will be explained below with reference to the flowchart of FIG. 2.

In FIG. 2, with the magnification of the image-forming lens system 6 fixed to a given constant value, the lens current of the radiation lens system is changed to enlarge the radiation area of the electron beam at step 21. Step 22 decides whether or not the electron beam is detected on the phosphor plate 7 as a result of enlarging the radiation area thereof. If the answer is "No", the process is returned to step 21 in order to further enlarge the radiation area of the electron beam. If the answer at step 22 is "Yes", the electron beam quantity $I_n$ on the phosphor plate is determined at step 23. This electron beam quantity represents an output value of the microprocessor 8 applied to the D/A converter 10b and is stored in the RAM contained in the microprocessor 8. Step 24 slightly increases the X-axis deflection current applied to the electron beam deflector 3a thereby to deflect the electron beam along X axis by a predetermined small amount. At step 25, the electron beam quantity $I_{n+1}$ radiated on the phosphor plate 7 at this time is determined, and at step 26, it is decided whether or not the electron beam quantity $I_n$ is larger than $I_{n+1}$, that is, whether or not the electron beam quantity is reduced by the small deflection along X axis. If it is decided that the electron beam quantity is increased, that is, it is decided that the answer is "No", the process is returned to step 23 for further deflection in the same direction. If the answer is "Yes", on the other hand, the electron beam quantity is maximum in the direction of negative X axis, so that step 27 stores the associated electron beam quantity $I_{n+1}$ as $I_m$ in the RAM. This process is followed by reducing the deflection current of the deflector 3a for minute deflection along the direction of negative X axis at step 28. The resulting electron beam quantity $I_{m+1}$ is determined at step 29, and it is decided whether or not the electron beam quantity $I_m$ is larger than $I_{m+1}$ at step 30. In the event that the answer is "No", the process is returned to step 27 for further movement in the direction of negative X axis. If the answer at step 30 is "Yes", on the other hand, it means that the deflection amount for the maximum electron beam quantity along X axis is successfully obtained.

Then the process is performed for obtaining the deflection amount representing the maximum electron beam quantity along the Y axis. First, step 31 performs the Y axis process, which is identical to the steps from 23 up to 26 and will not be explained in detail again. Similarly, the process along the negative Y axis of step 32 is identical to those from 27 to 30. Upon completion of step 32, the deflection amount representing the maximum electron beam quantity on the phosphor plate at that time is obtained. Since the electron beam is enlarged at step 21, however, the degree of alignment given by this deflection amount is very rough. Step 33 thus decides whether or not the electron beam is in spot form, and if the electron beam is not yet in spot form, step 34 changes the lens current of the radiation lens system 4 by a predetermined small amount in such a direction as to form an electron beam spot. The process is returned to step 23 for alignment along X and Y axes in the manner similar to the one mentioned above. The decision at step 33 is based on whether or not the current supplied to the radiation lens system 4 has reached to such a predetermined value as to provide a spot of a size not to damage the specimen or the phosphor plate. This predetermined value is obtained from experiments. If the answer at step 33 is "Yes", the currents of the deflectors for X and Y axes are held as they are, followed by step 35 where the lens current of the radiation lens system is restored to predetermined condition.

In the foregoing description of operation, it is impossible to determine the proper deflection amount in the event that the spot diameter 2a of the electron beam 2 on the phosphor plate is small as compared with the diameter of the phosphor plate 7 for detecting the electron beam, that is, the magnification is small. This is by reason of the fact that as long as the spot of the electron beam is positioned on the phosphor plate, the electron beam quantity detected remains constant regardless of the deflection.

Figure 4:
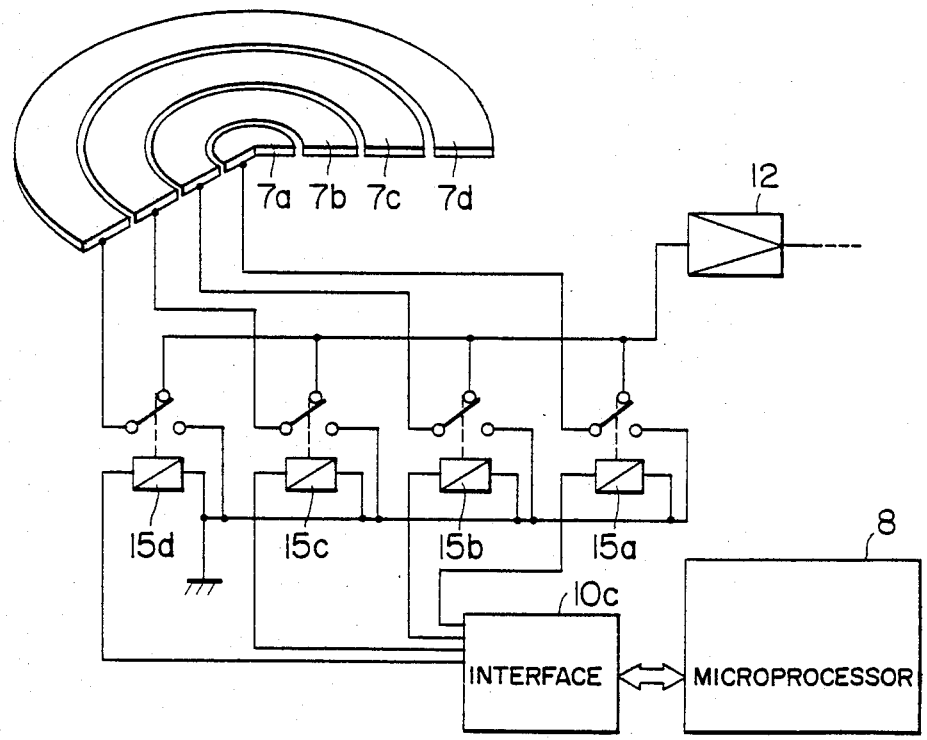
FIG. 4 is a sectional view of the phosphor plate according to the present invention.

FIG. 4 shows a further development of the present invention by providing phosphor plate sections 7a to 7d doubling as an electron beam detector element in order to obviate the above-mentioned disadvantages. As shown in FIG. 4, a phosphor plate is divided into a plurality of concentric phosphor plate sections, and relays 15a to 15d are controlled by the microprocessor 8 via the interface 10c thereby to change the area for detection of the electron beam. The operation of the apparatus using the phosphor plate sections doubling as a detector element such as this will be explained.

Assume that the electron beam is radiated on the end phosphor plate section 7d in spot form. If the relay 15d alone is turned off by the microprocessor 8, the electron beam is detected only in the case where the electron beam spot is deflected to the phosphor plates 7a to 7c, thus making it possible to identify the direction of deflection. With the detection area reduced, the deflection amount of the electron beam is determined again in such a manner as to maximize the electron beam quantity according to the flowchart of FIG. 2 as explained above and the resultant deflection amount is applied to the electron beam deflectors 3a and 3b. Similar procedures are repeatedly taken with progressively reduced detection area. When the electron beam is deflected to such an extent as to permit the detection of the electron beam only by the phosphor plate 7a, it means that the electron beam in spot form has reached the center of the phosphor plate, thus completing the adjustment of the optical axes.

Figure 5:
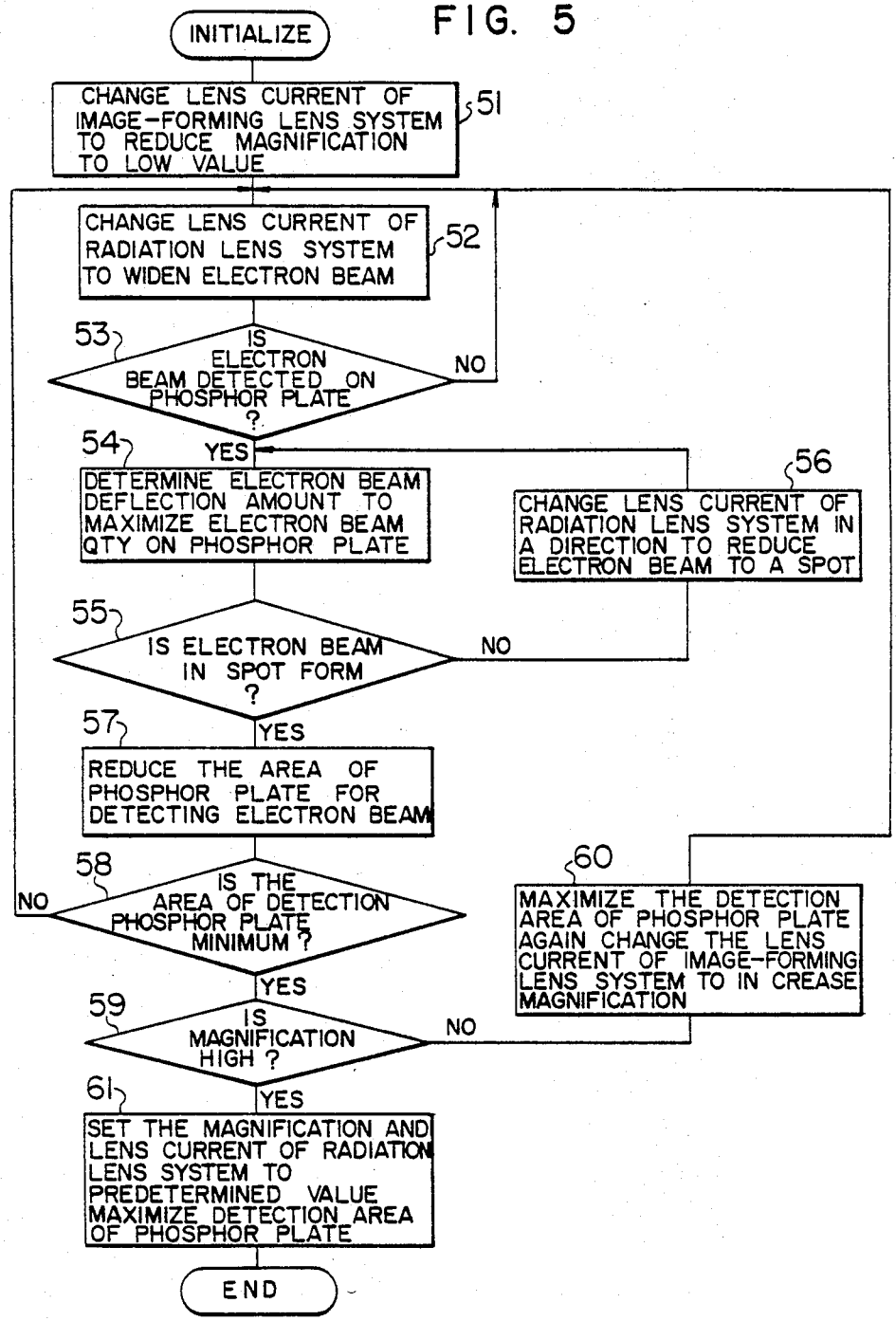
FIG. 5 is a flowchart for explaining the present invention.

FIG. 5 is a flowchart for optical axis adjustment to be performed on the basis of the configuration shown in FIG. 4. This flowchart permits the process of shorter processing time and higher accuracy. The operation will be explained below with reference to this flowchart.

First, the lens current of the image-forming lens system 6 is changed to reduce the magnification to less than several thousands at step 51. Once the magnification is reduced, the detection of the electron beam quantity is always made possible by preventing the image to be formed on the phosphor plate from leaving the phosphor plate far away even if the optical axes are misaligned to some degree. As a result, the electron beam is capable of being reduced to a spot form rapidly in the process of optical axis adjustment thereby to considerably shorten the processing time of the microprocessor for optical axis adjustment. Since the optical axis adjustment at low magnification is insufficient in accuracy, however, the optical axis adjustment with higher magnification is required. After the magnification reduction at step 51, the electron beam is enlarged until the radiation of the electron beam on the phosphor plate is detected at steps 52 and 53. The steps 52 and 53 thus correspond to steps 21 and 22 in FIG. 2. Step 54 determines the deflection amount in a manner to maximize the electron beam quantity detected on the phosphor plate. The step 54 thus corresponds to steps 23 to 32 in FIG. 2. Step 55 decides whether or not the electron beam is reduced to spot form and if the answer is "No", step 56 changes the lens current of the radiation lens system in such a direction as to reduce the electron beam to a spot. Steps 55 and 56 thus correspond to steps 33 and 34 in FIG. 2. If the answer at step 55 is "Yes", on the other hand, step 57 decreases the area of the phosphor plate for electron beam detection. When all the relays 15a to 15d are turned on in FIG. 4, for instance, the relay 15d is turned off. Next, step 58 decides whether or not the area of the phosphor plate connected to the electron beam detector circuit is minimum, that is, whether or not only the relay 15a connected to the phosphor plate 7a is turned on. If the answer is "No", the process is returned to step 52 for optical axis adjustment with a narrower phosphor plate in a manner similar to the one mentioned above. If the answer at step 58 is "Yes", by contrast, it means that the optical axis adjustment at low magnification is completed. In order to improve the accuracy of optical axis adjustment, however, the optical axis adjustment with a higher magnification is necessary. Step 59 decides whether or not the magnification of the apparatus is a predetermined high value, and if the answer is "No", step 60 restores the detection area of the phosphor plate sections 7a to 7d to the maximum value while at the same time changing the lens current of the imageforming lens system to increase the magnification by a predetermined amount, followed by step 52 for a similar optical axis adjustment. If the decision at step 59 is "Yes", the step 61 sets the magnification and the lens current of the radiation lens system at a predetermined value so that the detection area of the phosphor plates is maximized again to complete the optical axis adjustment. The high magnification determined at step 59 is approximately several hundred thousands, for instance, and is such that the spot image of the electron beam produced through the radiation lens system 4 is sufficiently contained in the screen.

In the optical axis adjusting apparatus described above, the burning of the phosphor plates may be prevented in adjusting operation by controlling the lens current of the radiation lens system in such a way that, in order to prevent the density of the electron beam quantity detected on the phosphor plates from exceeding a predetermined value, a value obtained in advance by experiments is stored in the ROM of the microcomputer and is compared with the present radiation lens current to prevent the latter from exceeding the predetermined value. In the foregoing description of the invention, although only an example of algorism is explained for determining the deflection amount of the electron beam for maximizing the electron beam quantity detected on the phosphor plates, various other algorisms are of course available. As an example, the electron beam is scanned in two directions and during the scanning, the electron beam quantity associated with the present deflection amount is determined from time to time to determine the deflection amount for maximizing the electron beam quantity thus obtained.

Although the embodiment of the present invention is described above with reference to the case using the comparator 11 as shown in FIG. 1, automatic optical axis adjustment is also possible by using only the amplifier 12 and the A/D converter 10b alone, in view of the fact that the amplifier 12 making up an exposure meter, the D/A converter 10b, the adder 13, the reference voltage source 14, the comparator 11 and the interface 10a are provided for the purpose of determining the electron beam quantity detected.

Further, the phosphor plate sections shown in FIG. 4 may be used in the manner mentioned below.

In photographing a diffraction image, it is common practice to determine the exposure by experience since the main beam is much brighter than the other diffraction dots or image so that it is difficult to determine the proper exposure. By using the phosphor plate shown in FIG. 4, only the main beam is applied to the phosphor plate section 7a to turn off the relay 15a alone. As a result, the electron beam quantity detected on the phosphor plate lacks the main beam and therefore it is possible to set the exposure corresponding to the brightness of the other diffraction dots or image so that the other diffraction dots or image are also capable of being clearly photographed. Partial exposure setting of the image is also possible.

It will be understood from the foregoing description that according to the present invention, a misalignment of the optical axes which may occur in the operation of the electron microscope is automatically adjusted without consuming the time and labor for adjusting the deflection amount of the electron deflector by the operator, thus greatly contributing to an improved operability of the electron microscope.

WHAT IS CLAIMED IS:

1. An optical axis adjusting apparatus for the electron microscope, comprising:
   a radiation lens system for adjusting the convergence of the electron beam radiated on a specimen;
   electron beam deflectors for adjusting the optical axis of said electron beam;
   an image-forming lens system for forming an enlarged image of the specimen by focussing the electron beam from said specimen;
   a phosphor plate for displaying the enlarged image and detecting the electron beam quantity applied thereto; and
   adjusting means for setting the optical axis by controlling said electron beam deflectors in a manner to maximize the electron beam quantity detected on said phosphor plate.

2. An apparatus according to claim 1, wherein said adjusting means includes first means for changing the current of the radiation lens system stepwise to reduce stepwise the diameter of the electron beam radiated on the specimen and second means for controlling said deflectors in a manner to maximize the electron beam quantity detected by said phosphor plate in each of said steps.

3. An apparatus according to claim 1, wherein said adjusting means further includes first means for changing the magnification stepwise from low to high value by changing the current of said image-forming lens system stepwise, and second means for controlling said deflectors in a manner to maximize the electron beam quantity detected by said phosphor plate in each of said magnification steps.

4. An apparatus according to claim 2, wherein said adjusting means further includes third means for changing the magnification stepwise from low to high value by changing the current of said image-forming lens system stepwise and fourth means for causing said first and second means to perform the control operation in each of said magnification steps.

5. An apparatus according to claim 1, wherein said phosphor plate is divided into a plurality of sections from the central portion toward the peripheral portion thereof.

6. An apparatus according to claim 5, wherein said sections of said phosphor plate are divided concentrically.

7. An apparatus according to claim 5, wherein each of said sections of said phosphor plate is connected to electron beam detector means through switch means.

8. An apparatus according to claim 5, wherein said adjusting means includes first means for enlarging the sections of the phosphor plate, progressively from the peripheral one, where the electron beam quantity applied is undetectable, and second means for controlling said deflectors in a manner to maximize the electron beam quantity detected by said phosphor plate in each of said enlarging steps.

9. An apparatus according to claim 8, wherein said second means includes third means for changing the current of the radiation lens system stepwise in a manner to reduce stepwise the diameter of the electron beam radiated on the specimen, and fourth means for controlling the deflectors in a manner to maximize the electron beam quantity detected by said phosphor plate in each of said steps of electron beam diameter.

10. An apparatus according to claim 8, wherein said adjusting means further includes third means for changing the magnification stepwise from low to high value by changing the current of said image-forming lens system stepwise, and fourth means for causing said first and second means to perform the control operation in each of said magnification steps.

11. An apparatus according to claim 9, wherein said adjusting means further includes fifth means for changing the magnification stepwise from low to high value by changing the current of said image-forming lens system stepwise, and sixth means for causing said first and fourth means to perform the control operation in each of said magnification steps.

12. A method of adjusting the optical axis of the elctron microscope, comprising:
  the first step for detecting the electron beam quantity radiated on a phosphor plate;
  the second step for adjusting the optical axis of the elctron beam by electron beam deflectors so as to maximize the detected electron beam quantity radiated on the phosphor plate;
  the third step for changing at least one of the condensing amount, the magnification amount, and the area of the phosphor plate of the electron beam optical system stepwise in such a direction as to permit the optical axis adjustment of the electron beam with higher accuracy;
  the fourth step for causing said first and second steps to be executed in each stage changed by said third step; and
  the fifth step for completing the optical axis adjustment when said third step reaches the final stage.

* * * * *